United States Patent [19]

Chu

[11] 4,164,648

[45] Aug. 14, 1979

[54] DOUBLE VERNIER TIME INTERVAL MEASUREMENT USING TRIGGERED PHASE-LOCKED OSCILLATORS

[75] Inventor: David C. Chu, Woodside, Calif.

[73] Assignee: Hewlett-Packard Company, Palo Alto, Calif.

[21] Appl. No.: 918,632

[22] Filed: Jun. 23, 1978

[51] Int. Cl.[2] .............................................. G01R 23/02

[52] U.S. Cl. ............................. 235/92 FQ; 235/92 T; 235/92 R; 324/187

[58] Field of Search ............ 235/92 FQ, 92 T, 92 TF, 235/92 CA; 324/187, 78 D

[56] References Cited

U.S. PATENT DOCUMENTS

| | | | |
|---|---|---|---|
| 3,505,594 | 4/1970 | Tarczy-Hornoch et al. | 324/187 |
| 3,611,134 | 10/1971 | McDowell | 324/187 |
| 3,970,828 | 7/1976 | Klein | 235/92 T |

*Primary Examiner*—Joseph M. Thesz

*Attorney, Agent, or Firm*—David A. Boone

[57] ABSTRACT

Measurement of a time interval between a start and a stop event is made by activating a start oscillator in response to the start event and activating a stop oscillator in response to the stop event. The number of cycles of each respective oscillator signal which occur between the activation of each oscillator and the coincidence of the respective oscillator signal with that of an independent time base is determined. The number of cycles of the time base signal between the coincident points of it and the start and stop oscillator signal is also determined. These numbers, which are always integers, are used along with the values for the time base period and the difference in frequency between the time base oscillator and the start and stop oscillators to calculate the time interval. Resolution of the measurement is dependent on the frequency difference between the time base signal and the start and stop oscillator signals. Two triggered-phase oscillators, which are phase-locked to the reference oscillator, are used to supply the start and stop frequencies. The start trigger and stop signals are used for phase shifting, i.e., restarting of the oscillators rather than starting the oscillators. This allows for pre-trigger frequency control, and essentially eliminates post trigger frequency drift which usually occurs when an oscillator is first started. The coincidence signals are provided by the phase cross-over between the phase locked oscillator and the reference by a digital mixer.

9 Claims, 6 Drawing Figures

$$\text{TIME INTERVAL} = 5\left[N_0 + \frac{257}{256}(N_1 - N_2)\right] \text{ns}$$

VOLTAGE CONTROLLED OSCILLATOR
LOOP FILTER
PHASE DETECTOR
÷N COUNTER
MIXER
COINCIDENT FLIP-FLOP
LOCKOUT FLIP-FLOP
INHIBIT GATE
SIGNAL S
TRIGGER
RESET
STARTABLE OSCILLATOR
PHASE SHIFT OSCILLATOR
VERNIER BURST
REFERENCE
VERNIER COINCIDENCE
MX
DV
f/N
$f_0 - f$
$f_0$
$t_1$
$t_2$
$t_3$
209
210
212
215
216
218
230
231
235
236
240
241
242
245
246
250
252
260
262
305
310
312
313
314
315
323
324
325
340
341
342
343
350
351

DOUBLE VERNIER TIME INTERVAL MEASUREMENT USING TRIGGERED PHASE-LOCKED OSCILLATORS

BACKGROUND OF THE INVENTION

Time interval measurements have been made by counting the number of pulses of a timing signal which occurred between the start and stop events. Also, various interpolating schemes have been devised to determine the time interval between the start and stop event with an accuracy greater than ±1 count of the timing pulses. See, for example, U.S. Pat. No. 3,133,189 issued to A. S. Bagley, et al on May 12, 1964 and entitled "Electronic Interpolating Counter For The Time Interval And Frequency Measurement".

A single vernier method has been used wherein the time between a trigger pulse and the next available clock pulse is measured in much the same way as the fraction of a graduation as indicated in a pair of vernier calipers. A trigger pulse starts an oscillator of period $T_0[1+(1/N)]$ which beats against the clock period $T_0$ as shown in FIG. 1. The time interval between the input trigger pulse and the "next" clock pulse can be determined by counting the number of pulses between the trigger and the point of coincidence. In the example of FIG. 1, this number is 4 (the unknown interval is proportional to this number). Coincidence between the vernier and the clock is detected, terminating the vernier count $N_1$. The time interval between the trigger signal and the next clock is given by $(T_0N_1)/N$.

These previous techniques had to overcome the severe problem of maintaining the frequency accuracy of the start and stop oscillators when first turned on, since the measurement is extremely sensitive to the frequency stability of the vernier signal (the main clock or time base is assumed to be stable). The interpolation factor of N requires stability of the order of $1/N^2$ under all conditions. Also, sub-nanosecond coincidence resolution required sub-nanosecond detection techniques. Circuits used in these techniques were required to be able to identify the "next" clock pulse without ±1 count ambiguity. The determination of the coincidence of the start and stop pulses with the time base was frequently ambiguous when the start or stop pulse occurred very near a clock pulse. Also, occurrence of the start pulse may not always precede the stop pulse in some measurements, but they may be random with respect to each other. Vernier methods generally offer no solutions to these problems.

SUMMARY OF THE INVENTION

In accordance with the preferred embodiment of the present invention, a time base clock signal is provided having a period $T_0$. A start channel oscillator is activated in response to a start event. A stop channel oscillator, having a frequency equal to that of the start channel oscillator, is activated in response to the stop event. The stop event need not necessarily follow the start event, but may come before it. The number of pulses of the start and stop channel oscillators which occur between the starting of the respective oscillators and the detection of the coincident point of each respective oscillator signal with the time base signal is accumulated. Also, the number of cycles of the time base signal which occurs between the detection of the coincident point of the start oscillator signal and the time base signal and the coincident point of the stop oscillator signal and the time base signal is counted. Since the stop event may precede the start event, both positive and negative time intervals may be measured. Phase-locked frequency synthesis techniques are used to establish the frequencies used for the start and stop channel oscillators. The oscillators are phase-locked to the time base and restarted in response to the start and stop events. The time base may be external and completely independent of the start and stop oscillators and the other measurement circuitry. Therefore, the most accurate time base available can be used.

DESCRIPTION OF THE PREFERRED EMBODIMENT

Figure 1:
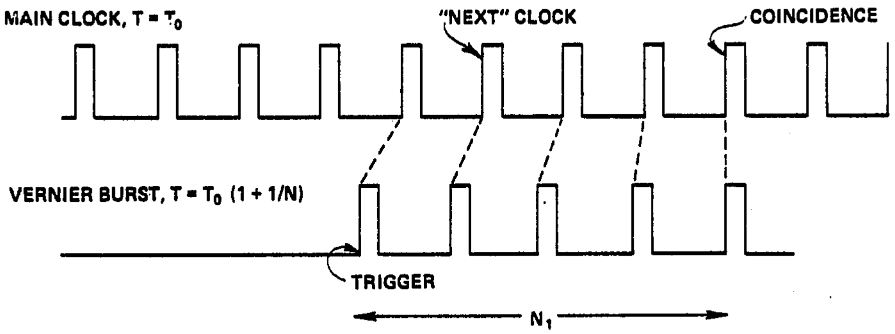
FIG. 1 is a timing diagram illustrating the operation of the vernier interpolation scheme used for frequency measurement.
Figure 2:
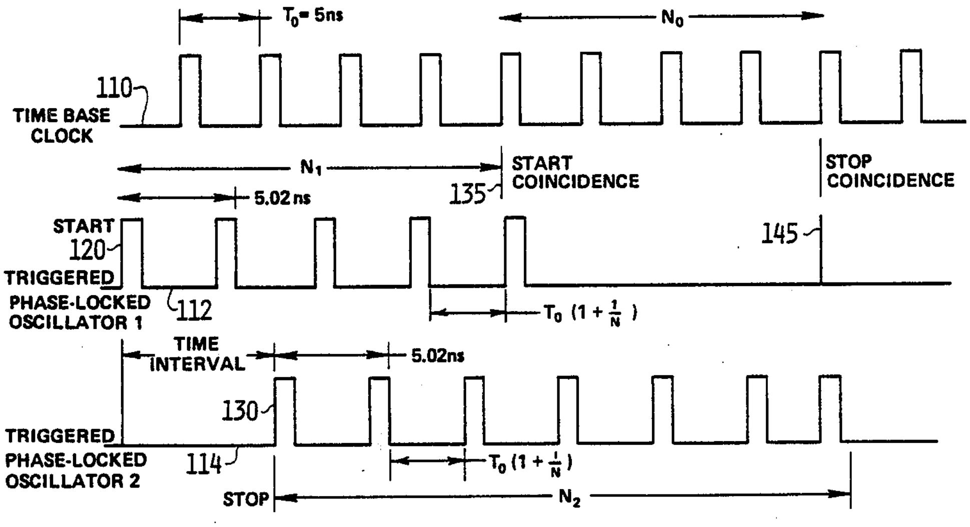
FIG. 2 is a timing diagram of the dual-vernier technique used in the preferred embodiment of the present invention.

Referring to FIG. 2 there is shown a time base clock signal 110, a start channel oscillator signal on line 112, and a stop channel oscillator signal on line 114. The start channel oscillator begins to provide the signal on line 112 in response to the start event occurring at time 120. Similarly, the stop channel oscillator begins to provide the stop channel signal on line 114 in response to the stop event which in the example of FIG. 2 is shown to occur at time 130. It is the time interval between the start event at time 120 and the stop event at time 130 which is to be measured, using the method of the preferred embodiment.

The time base signal on line 110 has a period equal to $T_0$. The signals on line 112 and line 114 have a period equal to $T_0(1+1/N)$. The difference between the signals provided by the start and stop channel oscillators and the time base signal on line 110 determines the resolution of the measurement. In the example shown $T_0$ is 5 nanoseconds and the period of the start and stop channel oscillators signals is 5.02 nanoseconds for $N=256$. The resolution of the method of the preferred embodiment is determined by the formula $\pm T_0/N$ per channel or $\pm 2T_0/N$ for start and stop, and using the values in the above example, it would be possible to measure a signal with an ideal accuracy of 40 picoseconds. The start channel oscillator provides the signal on line 112 in response to start event 120 and will continue to do so until a coincident point between the time base signal on line 110 and the start channel oscillator signal on line 112 is detected, e.g., at point 135. Similarly, the stop channel oscillator begins to provide the signal on line 114 in response to stop event 130 and continues to do so until the coincidence point of the stop channel oscillator signal on line 114 and the time base signal on line 110 is detected, e.g., at point 145.

Three integer numbers are thus obtained which enable the calculation of the time interval. $N_1$ is the number of cycles of the signal on line 112 between start event 120 and the detection of coincident point 135. $N_2$ is the number of cycles of the signal on line 114 between stop event 130 and coincident point 145. $N_0$ is the number of cycles of the time base signal on line 110 between coincident points 135 and 145. $N_0$ is a positive number if coincident point 135 occurs before coincident point 145. If coincident point 145 is detected before coincident point 135, then $N_0$ is a negative number. The numbers obtained for $N_0$, $N_1$ and $N_2$ are always integers. Calculation of the time interval may then be obtained choosing the following formula:

$$\text{Time interval} = T_0[(1+1/N)(N_1-N_2)+N_0]$$

Using the specific values as discussed above with respect to FIG. 2, this formula simplifies to:

$$\text{Time interval} = 5[N_0+(257/256)(N_1-N_2)]ns$$

It should be appreciated that a completely equivalent system can be generated using the upper side band, i.e., $T_0(1-1/N)$ as the oscillator period rather than $T_0(1+1/N)$.

Figure 3:
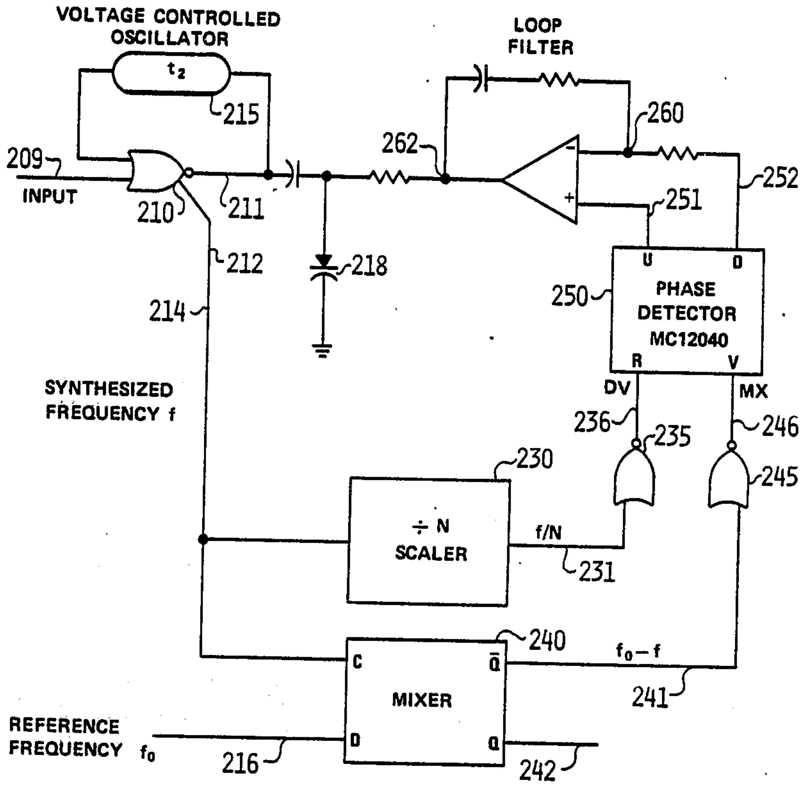
FIG. 3 is a circuit diagram of the triggered phase-locked loop oscillator used in the preferred embodiment.

Referring now to FIG. 3, there is shown the basic phase-locked loop oscillator used in the preferred embodiment. (This circuit is similar to that shown in U.S. Pat. No. 3,921,095 issued Nov. 18, 1975 to David Chau-Kwong Chu entitled "Startable Phase-Locked Loop Oscillator".) Vernier pulse bursts 112 (and 114) and coincidence signals 135 (and 145) of FIG. 2 are obtained from two such said phase-lock loop oscillators as signals 341 and 351. The basic oscillator circuit consists of an inverting gate 210 and the delay element 215. When the input signal on a line 209 is low, the oscillator circuit produces a signal with a frequency having a period that is twice the delay around the feedback loop. In the basic phase-lock loop, the oscillation frequency is voltage tuned across a sufficient range by a varactor 218 across the output. Note that the tuning voltage to the voltage controlled oscillator is a DC signal changing very slowly to compensate for variations in temperature, power supply voltages and circuit component values. The output of the voltage controlled oscillator is fed to two channels; a mixer 240 and a frequency scaler 230. The mixer generates a beat frequency signal between the signal of frequency f on line 214 and the reference frequency signal on line 216. The mixer outputs a signal on line 241 at a frequency which is actually the difference frequency, $f_0-f$. The frequency scaler 230 produces a signal on line 231 whose frequency is equal to f/N where N of course, is an integer. The signals on lines 231 and 241 are fed through inverting gates 235 and 245 respectively to phase detector 250, e.g., an MC12040 or the like manufactured by Motorola and others, which monitors the positive transitions of the two input signals. The phase detector produces output pulses on lines 251 and 252 which are then filtered and integrated by loop filter circuit 260, producing a voltage signal on a line 262 which is then used to tune the voltage controlled oscillator via varactor diode 218 thus closing the phase-lock loop circuit.

Under phase-lock conditions, the two signals to the phase detector 250 the signal DV on line 236 and the signal MX on line 246 are of the same frequency and in phase since $f/N=f_0-f$ Hence, the voltage controlled oscillator signal output on line 212 has a frequency, f, equal to $$f=f_0N/(N+1)$$

Note that the signal on line 214 has a frequency, f, that is slightly offset from the reference frequency $f_0$ of the signal on line 216. If, for example, N is 256, then $f=f_0\times256/257$, or f is about 0.996$s_0$1. As long as the input signal on line 209 is held low, this locked condition will remain constant.

Since mixer 240 shown in FIG. 3 is actually a D-type edge-triggered flip-flop, a positive transition at the mixer output Q on line 242 signifies phase coincidence between the reference frequency, $f_0$, which is input via line 216 to the D input and the synthesized frequency, f, input via line 214 to the clock input of mixer 240. Also, the two signals input to phase detector 250, the signal DV on line 236 and the signal MX on line 246 are in phase and at frequency $f_0/(N+1)$. A positive transition in the signal on line 246 occurs at the same time as a positive transition in the signal on line 236 which occurs when the frequency scaler 230 switches from a full count of N−1 to 0.

Figure 4:
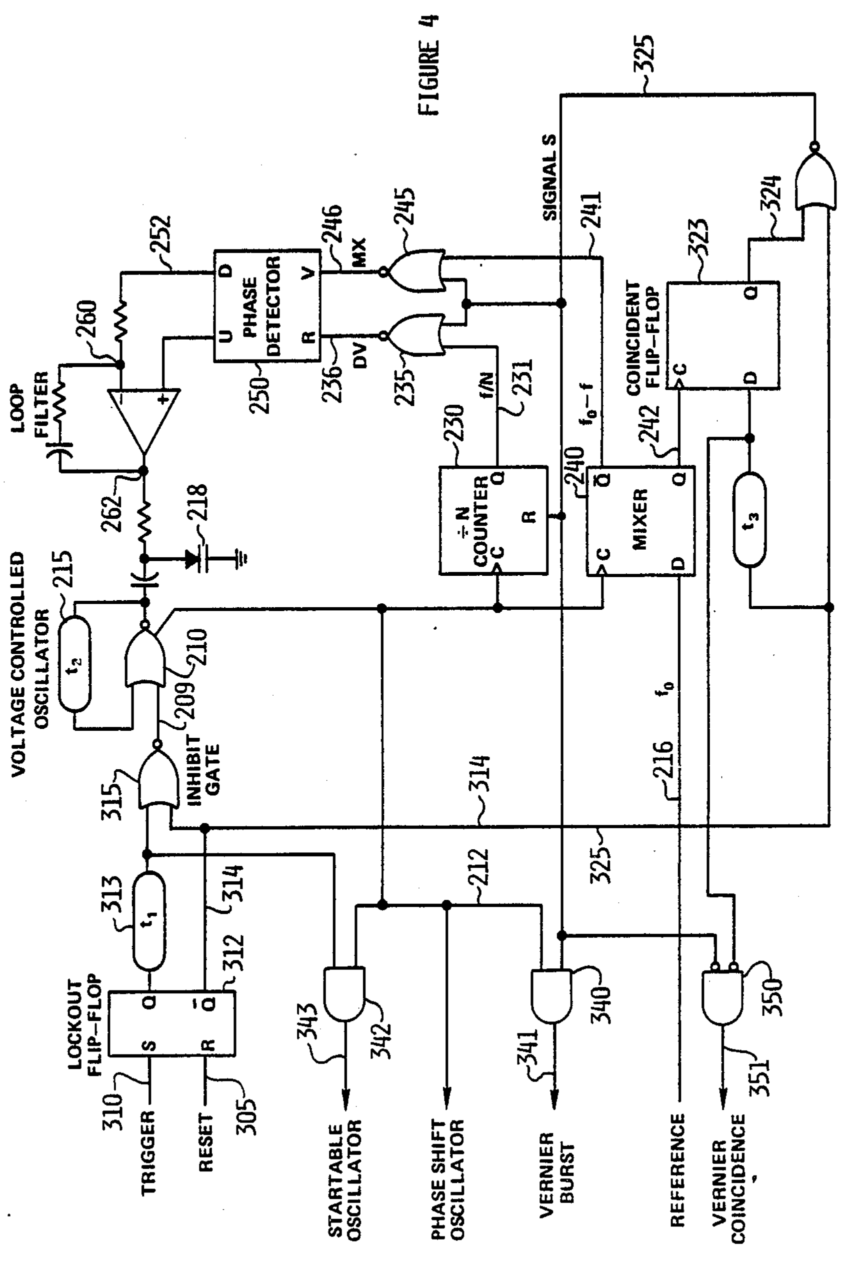
FIG. 4 is a more detailed schematic diagram of the triggered phase-locked oscillator circuit used in the preferred embodiment.

FIG. 4 shows a circuit diagram of the phase-lock loop circuit of FIG. 3 with a triggering input. Under quiescent conditions, the voltage controlled oscillator is producing a signal on line 212 at the desired frequency f. An input trigger pulse on a line 310 sets the lock-out flip-flop 312. The time difference $t_1$ of the arrival of the $\overline{Q}$ signals to the inhibit gate 315 generates a positive pulse of duration $t_1$ on line 209. This pulse stops the oscillation of the voltage control oscillator within one-half of a period, T/2, $t_1$ being designed to be longer than T/2. After a time equal to $t_1$ has passed, the inhibit signal on line 209 again goes low and the oscillation recommences. However, this oscillation is now in phase with the removal of the inhibit signal on line 209 which is precisely $t_1$ in time after the trigger input. Thus, the phase of the new oscillations is directly related to the time of arrival of the trigger input on line 310. Also, it is independent of the phase of the oscillations before the trigger input arrived.

Now it is desirable to maintain this new phase while the oscillator remains phase-locked to the reference signal on line 216. The new phase of the oscillator will be translated into a new phase of the beat frequency of the signal on line 241 by the same angle through mixer 240, but at the mixer output's lower frequency.

At this point, the phase detector 250 must be disabled or else it will produce a sudden change in tuning voltage that will shift the voltage controlled oscillator frequency, which is not desired. The new phase of the signal on line 246 thus is momentarily shielded from phase detector 250 by the signal S on a line 325 which goes high with the output $\overline{Q}$ signal on line 314 from lock-out flip-flop 312. This signal on line 325 acts on the two inverting gates 235 and 245 causing both the signals on line 236 and line 246 to go low and disable phase detector 250. This same signal on line 325 resets scaler 230 and holds it at count zero.

After a delay of $t_3$, the coincident flip-flop 323 is receptive to being clocked. Within the beat period $T_0(N+1)$, the new beat frequency signal on line 241 from mixer 240 reaches a positive transition, signifying that the voltage controlled oscillator and the reference are phase coincident. This transition clocks the phase coincidence flip-flop 323 so that the output Q switch on line 324 is switched to the high state which in turn causes the signal on line 325 to go low allowing the scaler 230 to begin counting in response to the signal on line 212.

Also, the signal on line 325 causes the signals on lines 236 and 246 to go high simultaneously. Phase detector 250 which is monitoring the positive transitions of these signals, interprets the rise in these signals as a satisfactory phase lock condition, produces no significant correction pulses at its output, and therefore there is no frequency change by the voltage controlled oscillator.

The phase lock loop now acts precisely as it did before the receipt of the trigger input on line 310, but the new phase of the oscillator will be preserved by the phase lock loop. Since scaler 230 has been adjusted in phase to match the new phase of the output signal from mixer 240, phase locking will continue at this new mixer phase. The lock-out flip-flop 312 may now be reset by a signal on line 305. This will have no effect on the phase lock loop. However, subsequent to the resetting of lock-out flip-flop 312, another trigger input may be received on line 310 which will then cause the voltage controlled oscillator to restart and provide a signal of frequency f on line 212 which is in phase with this new trigger signal.

The output of the voltage controlled oscillator can be gated via gate 342 to suppress all oscillations before the arrival of the trigger input on line 310. The signal of frequency 212 can also be gated via gate 340 onto a line 341 when it is enabled by the signal on line 325. Therefore, in response to the trigger input on 310, the oscillator is restarted in phase with the trigger signal, and the signal is then gated onto line 341. This will continue until a coincident point is detected between the reference frequency signal on line 216 and the signal on line 212 by coincident flip-flop 323 which will cause the removal of the signal S on line 325 and therefore the disabling of gate 340. Note that coincidence detection is automatically given by the phase cross-over between the reference signal on line 216 and the voltage controlled oscillator signal on line 212, signified by switching of mixer flip-flop 240. This coincident detection technique is more clearly explained with reference to FIG. 5.

The vernier coincidence 350 signal must occur at the end of the vernier burst 341. Prior to the arrival of a trigger pulse on line 310, the lock-out flip-flop 312 is at a low state and therefore its $\overline{Q}$ output on line 314 is high, disabling gate 350 whose output is low. After triggering, the signal S on line 325 is high and continuesto disable gate 350, even though 314 switched to low after $t_3$. However, at coincidence, signal 325 will go low, enabling gate 350 and making the signal on line 351 go high. Therefore, the vernier coincidence signal on line 351 goes high at coincidence at the end of the vernier burst.

Signal 351 will remain high until lock-out flip-flop 312 is reset via 305.

It should be appreciated that signal 351 is a special phase cross-over which occurs only once for every time the circuit is triggered. There are, however, other phase cross-overs which occur steadily once every $T_0(N+1)$.

Figure 5:
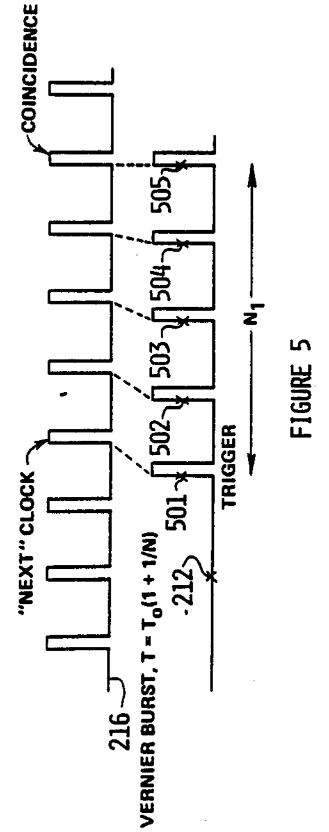
FIG. 5 illustrates the coincidence detection technique used in the preferred embodiment.

Assume that the reference signal on line 216 is the top signal in FIG. 5 and is connected to the D input. The bottom signal is the signal on line 212 and is connected to the clock input. Also assume that the D flip-flop used for mixer 240 is a leading-edge-triggered flip-flop. Note that when the signal on line 212 clocks flip-flop 240 at points 501, 502, 503 and 504, the D input on line 216 will be low, and hence the flip-flop will remain reset, i.e., the signal on line 241 will remain high and the signal on line 242 will remain low. However, at point 505, the signal on 216 is high at the D input at the leading edge of the clock pulse of the signal on line 212, hence the flip-flop 240 is set causing the signal on line 241 to go low and the signal on line 242 to go high. The signal on 242 clocks coincident flip-flop 323 causing it to set and cause the signal on line 325 to go low.

Figure 6:
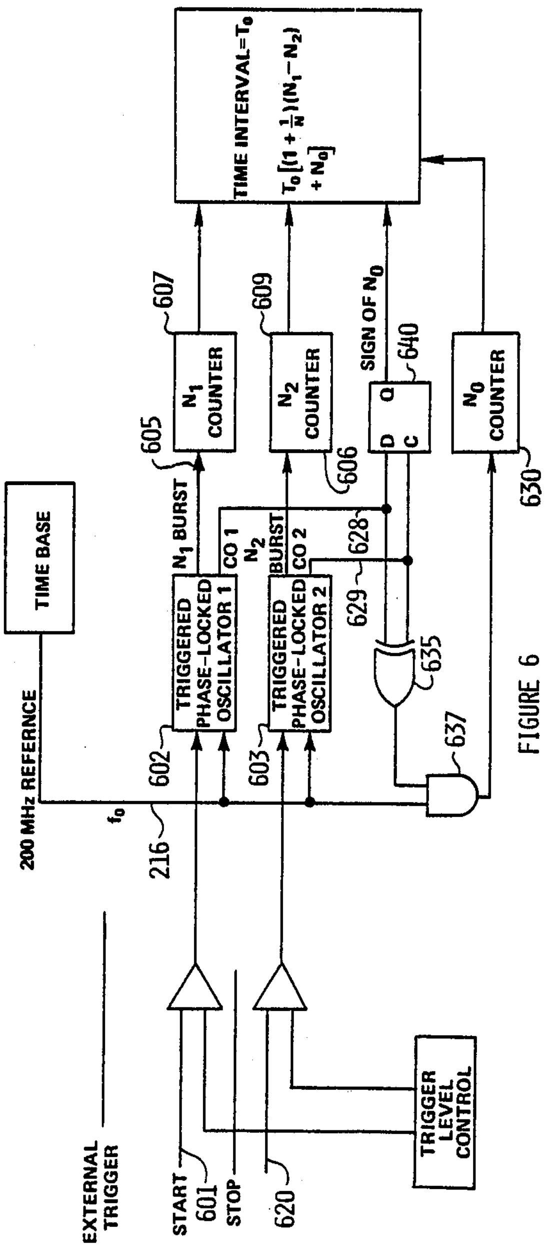
FIG. 6 is a block diagram of a system utilizing the technique of the preferred embodiment.

Referring now to FIG. 6, there is shown a block diagram of the complete circuitry for determining $N_0$, $N_1$ and $N_2$ in order to measure a time interval. A start pulse on line 601 causes the restarting of a triggered phase-lock oscillator 602. The output of oscillator 602 on a line 605 is then counted by a counter 607. This continues until coincidence is detected between the signal from oscillator 602 and the time base signal on line 216.

The stop pulse on line 620 causes the restarting of triggered phase-locked oscillator 603. The output of oscillator 603 on a line 606 is then counted by a counter 609. $N_0$ is determined by counter 630. This counter is controlled by the signals on lines 628 and 629 which indicate the coincidence of the time base signal and the signals on lines 605 and 606, respectively. Exclusive OR gate 635 enables the counting of the time base signal on line 216 when the first coincident point is detected. The detection of the second coincident point terminates the counting by disabling gate 637. Since the other values required for calculation of the time interval are known by design, once $N_0$, $N_1$ and $N_2$ are determined, the unknown time interval, $T_0$, can be calculated.

The sign of $N_0$ is indicated by flip-flop 640 which monitors whether the start oscillator or the stop oscillator signal first reaches coincidence. A positive sign is generated if start coincidence appears before the stop coincidence, and a negative sign is generated if the reverse is true. In case the coincidences occur simultaneously, the sign is indeterminate, but immaterial, since the value of $N_0$ is zero in this case.

Using the above scheme, the time interval so computed will be automatically positive if start pulse arrives ahead of stop pulse and negative vice versa. No other circuit is needed to determine which arrives first.

It should be noted that for measuring time intervals greater than $(N+1)T_0$, it is not necessary to detect the order of the coincident points since the start coincident point 135 will always precede the stop coincident point 145. It is also possible, for such cases, to use the same vernier oscillator to generate both the start and stop phaselocked oscillator signals.

I claim:

1. A method for measuring a time interval between a start and stop event, said method comprising the steps of:

providing a time base signal having a predetermined period, $T_0$;

providing a start oscillator signal in response to and phase coherent with the detection of the start event;

providing a stop channel oscillator signal in response to and phase coherent with the stop event;

accumulating an indication of the recurrences of the start channel oscillator signal from the time the start event is detected until a coincident point between the start oscillator signal and the time base signal is detected, said indications comprising an integer $N_1$;

accumulating an indication of the recurrences of the stop channel oscillator signal between the detection of the stop event and a coincident point between said stop channel oscillator signal and said time base signal, said indications comprising an integer $N_2$; and accumulating an indication of the recurrences of the time base signal between the detection of a coincident point between said start channel oscillator signal and said time base signal and the detection of a coincident point between said stop channel oscillator signal and said time base signal, said indication comprising an integer, $N_0$.

2. The method as in claim 1 wherein the start and stop oscillator signals are provided by the same oscillator for measurement of time intervals greater than $(N+1)T_0$.

3. The method as in claim 1 and further comprising the step of detecting the order of arrival of the two said coincident points and thus determining the sign of $N_0$.

4. The method as in claim 3 wherein said start channel oscillator signal and said stop channel oscillator signal have the same preselected period and the period of said start channel oscillator signal and said stop channel oscillator signal differs from said time base signal by a preselected time interval.

5. The method as in claim 4 wherein the difference in the period of said start channel and stop channel oscillators differs from said base signals period by a value of $T_0/N$ and said time interval is computed in accordance with the following formula:

$$\text{Time interval} = [(1+1/N)(N_1-N_2)+N_0]$$

6. The method as in claim 4 and further comprising the steps of phase-locking the start and stop channel oscillator signals to the time base oscillator signal prior to the occurrence of the start and stop events; and phase shifting the start and stop channel oscillators in response to the occurrences of the start and stop events, respectively.

7. The method as in claim 6 and further comprising the steps of suspending any phase-lock loop tuning between the occurrence of the start and stop events and the determination of said coincident points.

8. The method as in claim 7 wherein determining said coincident points between said start oscillator signal and said time base signal and the coincident point between said stop oscillator and said time base signal comprises the step of mixing said signals to produce beat frequency signals.

9. The method as in claim 8 wherein the step of mixing said signals to produce beat frequency signals comprises the step of gating said signals to the clock and input of an edge triggered flip-flop to produce the beat frequency signal at the flip-flop output.

* * * * *

UNITED STATES PATENT AND TRADEMARK OFFICE
CERTIFICATE OF CORRECTION

PATENT NO. : 4,164,648

DATED : August 14, 1979

INVENTOR(S) : David C. Chu

It is certified that error appears in the above-identified patent and that said Letters Patent are hereby corrected as shown below:

Column 4, line 68, change "Q" to read -- $\bar{Q}$ --.

Signed and Sealed this

*Thirteenth* Day of *November 1979*

[SEAL]

*Attest:*

RUTH C. MASON
*Attesting Officer*

LUTRELLE F. PARKER
*Acting Commissioner of Patents and Trademarks*